(12) United States Patent
Hartmann et al.

(10) Patent No.: US 11,127,671 B2
(45) Date of Patent: Sep. 21, 2021

(54) POWER SEMICONDUCTOR MODULE

(71) Applicant: ABB Power Grids Switzerland AG, Baden (CH)

(72) Inventors: Samuel Hartmann, Staufen (CH); Dominik Truessel, Bremgarten (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/423,531

(22) Filed: May 28, 2019

(65) Prior Publication Data

US 2019/0279927 A1 Sep. 12, 2019

Related U.S. Application Data

(63) Continuation of application No. PCT/EP2017/080529, filed on Nov. 27, 2017.

(30) Foreign Application Priority Data

Nov. 25, 2016 (EP) ..................................... 16200714

(51) Int. Cl.
*H01L 23/50* (2006.01)
*H01L 23/492* (2006.01)
(Continued)

(52) U.S. Cl.
CPC ............ *H01L 23/50* (2013.01); *H01L 23/492* (2013.01); *H01L 23/49811* (2013.01);
(Continued)

(58) Field of Classification Search
CPC ... H01L 23/50; H01L 23/5286; H01L 23/492; H01L 25/042; H01L 25/0655;
(Continued)

(56) References Cited

U.S. PATENT DOCUMENTS 5,347,158 A * 9/1994 Matsuda ............... H01L 23/645
257/691
6,054,765 A * 4/2000 Eytcheson .............. H01L 24/49
257/693
(Continued)

FOREIGN PATENT DOCUMENTS

EP 0427143 A2 5/1991
EP 2317551 A1 5/2011
(Continued)

OTHER PUBLICATIONS

European Patent Office, International Search Report & Written Opinion issued in corresponding Application No. PCT/EP2017/080529, dated Mar. 7, 2018, 10 pp.

*Primary Examiner* — David A Zarneke
(74) *Attorney, Agent, or Firm* — Slater Matsil, LLP

(57) ABSTRACT

Power semiconductor module, including a base plate with at least one substrate located on the base plate, wherein an electronic circuit is provided on the at least one substrate, wherein located on the at least one substrate are electrical connectors comprising a DC+ power terminal, a DC− power terminal and an AC power terminal and further a control connector, wherein the power semiconductor module is designed as a half-bridge module including a first amount of switching power semiconductor devices and a second amount of switching power semiconductor devices, wherein the base plate includes a contact area, a first device area and a second device area, wherein the contact area is positioned in a center of the base plate such, that the first device area is positioned at a first side of the contact area and that the second device area is positioned at a second side of the contact area, the second side being arranged opposite to the first side, wherein the DC+ power terminal, the DC− power terminal, the AC power terminal and the control connector are positioned in the contact area, wherein the first amount
(Continued)

of switching power semiconductor devices is positioned in the first device area and wherein the second amount of switching power semiconductor devices is positioned in the second device area, wherein all the power semiconductor devices in the first device area are located in two parallel lines being aligned parallel to the width of the base plate and wherein all the power semiconductor devices in the second device area are located in two parallel lines being aligned parallel to the width of the base plate.

20 Claims, 2 Drawing Sheets

(51) Int. Cl.
*H01L 23/00* (2006.01)
*H01L 25/07* (2006.01)
*H01L 25/18* (2006.01)
*H01L 23/498* (2006.01)
*H01L 25/11* (2006.01)

(52) U.S. Cl.
CPC ............ *H01L 24/48* (2013.01); *H01L 25/072* (2013.01); *H01L 25/18* (2013.01); *H01L 24/49* (2013.01); *H01L 25/115* (2013.01); *H01L 2224/0603* (2013.01); *H01L 2224/4826* (2013.01); *H01L 2224/48137* (2013.01); *H01L 2224/48245* (2013.01); *H01L 2224/48472* (2013.01); *H01L 2224/49111* (2013.01); *H01L 2924/00014* (2013.01); *H01L 2924/1203* (2013.01); *H01L 2924/13055* (2013.01); *H01L 2924/13091* (2013.01); *H01L 2924/14252* (2013.01); *H01L 2924/19107* (2013.01)

(58) Field of Classification Search
CPC . H01L 25/072; H01L 25/0753; H01L 25/115; H02M 7/003
See application file for complete search history.

(56) References Cited

U.S. PATENT DOCUMENTS

| | | | | |
|---|---|---|---|---|
| 6,987,670 | B2* | 1/2006 | Ahmed | H01L 24/49 165/80.4 |
| 8,076,696 | B2* | 12/2011 | Beaupre | H01L 24/49 257/177 |
| 8,675,379 | B2* | 3/2014 | Smolenski | H05K 7/1432 363/132 |
| 9,795,049 | B2* | 10/2017 | Tada | H05K 7/1432 |
| 9,853,378 | B2* | 12/2017 | Kim | H01R 12/7088 |
| 2002/0118560 | A1* | 8/2002 | Ahmed | H01L 23/66 363/144 |
| 2006/0274561 | A1* | 12/2006 | Ahmed | H02M 7/53871 363/132 |
| 2006/0290689 | A1* | 12/2006 | Grant | H02M 7/003 345/204 |
| 2014/0120774 | A1* | 5/2014 | Kim | H01L 24/49 439/626 |
| 2014/0218871 | A1* | 8/2014 | Kim | H01R 12/7088 361/748 |
| 2018/0090441 | A1* | 3/2018 | Traub | H01L 23/5385 |
| 2018/0183321 | A1* | 6/2018 | Cyr | H01L 25/18 |
| 2019/0181770 | A1* | 6/2019 | Martin | H05K 7/20172 |
| 2020/0066686 | A1* | 2/2020 | Mohn | H01L 23/5386 |
| 2020/0151224 | A1* | 5/2020 | Abrahami | G06F 16/972 |

FOREIGN PATENT DOCUMENTS

| | | |
|---|---|---|
| WO | 2015175820 A1 | 11/2015 |
| WO | 2015176985 A1 | 11/2015 |

* cited by examiner

POWER SEMICONDUCTOR MODULE

TECHNICAL FIELD

The present invention relates to a power semiconductor module. The present invention refers to a power semiconductor module showing an improved high performance while requiring only very limited space.

BACKGROUND ART

Power semiconductor modules comprising power semiconductor devices, such as switching power semiconductor devices are generally known in the art. For example, it is known to provide power semiconductor modules being arranged in a so-called half-bridge configuration in which the power semiconductor devices are arranged in a low side switch area and a high side switch area.

A typical layout of a half-bridge module with good current sharing between the chips may be designed such, that DC+ and DC− terminals are guided toward the center of the module and connected down to the substrate of a base plate. The AC terminal is connected down to the substrate on the side of module. Also the control circuit is typically connected to the substrate on the side of the module.

The design of state of the art power modules poses several challenges. A first challenge is having a high current rating of the module with limited size. A second challenge is having the paralleled chips sharing the current evenly during switching events.

The solutions of the prior art, however, still give room for improvements regarding providing a good performance thereby using only limited size.

EP 2 317 551 A1 describes a device which includes a first conductive substrate and a second conductive substrate. A first power semiconductor component having a first thickness can be electrically coupled to the first conductive substrate. A second power semiconductor component having a second thickness can be electrically coupled to the second conductive substrate. A positive terminal can also be electrically coupled to the first conductive substrate, while a negative terminal can be electrically coupled to the second power semiconductor component, and an output terminal may be electrically coupled to the first power semiconductor component and the second conductive substrate. The positive and negative power terminals (DC+ and DC−) are formed as plates parallel to each other and separated from each other by an insulation layer. The DC+ and DC− terminals lead away from the semiconductor module in perpendicular direction to the plane, in which the semiconductor components are arranged. Each substrate comprises an IGBT on an outer side of the module and a diode towards the power terminals.

WO 2015/175820 A1 describes a power module which includes a housing with an interior chamber and multiple switch modules mounted within the interior chamber of the housing. The switch modules are interconnected and configured to facilitate switching power to a load. Each one of the switch modules includes at least one transistor and at least one diode. The at least one transistor and the at least one diode may be formed from a wide band-gap material system, such as silicon carbide (SiC), thereby allowing the power module to operate at high frequencies with lower switching losses when compared to conventional power modules.

DISCLOSURE OF INVENTION

It is an object of the present invention to provide a power semiconductor module which overcomes at least one drawback of the prior art. It is an object of the present invention to provide a power semiconductor module which shows a high current rating and thus a good performance together with evenly sharing the current during switching events, thereby requiring only limited space.

These objects are at least partly solved by a power semiconductor module according to independent claim 1. Advantageous embodiments of the present invention are given in the dependent claims, in the further description as well as in the figures, wherein different embodiments can, alone or in any combination, provide a feature of the present invention unless not clearly excluded.

The present invention provides a power semiconductor module, comprising a base plate with at least one substrate located on said base plate, wherein an electronic circuit is provided on a said at least one substrate, wherein located on the at least one substrate are electrical connectors comprising a DC+ power terminal, a DC− power terminal and an AC power terminal and further a control connector, wherein the power semiconductor module is designed as a half-bridge module comprising a first amount of switching power semiconductor devices and a second amount of switching power semiconductor devices, wherein the base plate comprises a contact area, a first device area and a second device area, wherein the contact area is positioned in a center of the base plate such, that the first device area is positioned at a first side of the contact area and that the second device area is positioned at a second side of the contact area, the second side being arranged opposite to the first side, wherein the DC+ power terminal, the DC− power terminal, the AC power terminal and the control connector are positioned in the contact area, wherein the first amount of switching power semiconductor devices is positioned in the first device area and wherein the second amount of switching power semiconductor devices is positioned in the second device area, wherein all the power semiconductor devices in the first device area are located in two parallel lines being aligned parallel to the width of the base plate and wherein all the power semiconductor devices in the second device area are located in two parallel lines being aligned parallel to the width of the base plate.

Such a power semiconductor module provides an increased current rating together with a good switching behaviour, thereby requiring only limited space. The present invention thus refers to a power semiconductor module. Such a power semiconductor module comprises an electronic circuit being provided on a base plate, or at least one substrate being located thereon, respectively, which is generally known per se. The electronic circuit comprises a plurality of electrical conductors, such as metallizations, and terminals or connectors, which are used for externally and internally connecting different parts of the power semiconductor module. The terminals or connectors are thereby exemplarily located on respective positions on the conductors, such as on the metallizations.

For example, located on the at least one substrate are electrical connectors comprising DC+, DC− and AC power terminals and further provided are one or more control connectors. In other words, electrical connectors are connected to the at least one substrate, wherein the connectors electrically contact electrically conductive structures, such as metallizations, which are provided on the at least one substrate.

In detail, it may be advantageous that four substrates are positioned on the base plate, wherein each substrate carries a part of the electric circuit. This may allow an easy and adaptable production of the power module.

With this regard, it may be exemplarily that at least two substrates are arranged identically. This shall exemplarily mean that the same amount and type of devices is arranged at the same positions. Referring to a half-bridge configuration, the high side switch and the low side switch may be formed identically. Such a configuration allows an easy production process.

Further, as it is generally known in the art, the power semiconductor module comprises a plurality of power semiconductor devices. Exemplarily, a plurality of switching devices are provided, such as IGBT devices, MOSFET and/or the like. Exemplarily, the power semiconductor module is designed as a half-bridge module. Therefore, it comprises a first amount of switching power semiconductor devices and a second amount of switching power semiconductor devices. The switching devices are potentially provided as IGBT chips and diodes, for example. With regard to the first amount of switching power semiconductor devices and a second amount of switching power semiconductor devices the respective amount may be called the low switch side and high switch side, respectively, like it is generally known in the art for half-bridge modules.

The base plate of the power semiconductor module as described above is further divided in specific areas. The respective areas are arranged in a specific way or in other words, the distinct areas are used for locating distinct features of the power semiconductor module at distinct positions of the base plate.

With this regard, the base plate comprises a contact area, a first device area and a second device area. These areas are located in a special way on the base plate. In detail, it is provided that the contact area is positioned in a center of the base plate such, that the first device area is positioned at a first side of the contact area and that the second device area is positioned at a second side of the contact area, the second side being arranged opposite to the first side exemplarily regarding the length of the base plate. In other words, the contact area is framed, or flanked, respectively, by the first device area and the second device are exemplarily in the length of the base plate.

It is further provided that the DC+, DC− and AC power terminals and the control connectors are positioned in the contact area, and that the first amount of switching power semiconductor devices is positioned in the first device area and that and the second amount of switching power semiconductor devices is positioned in the second device area. Therefore, at a power semiconductor module as described before, the DC+, DC− and AC power terminals and the control connectors and thus exemplarily all power and control connectors present on the circuit board are located in one distinct central area, i.e. the contact area. The power semiconductor devices and thus the switching devices are further located in the first and second device area, respectively, wherein it is provided that the first amount of switching devices is located in the first device area and that the second amount of switching devices is located in the second device area. For example, each amount of switching devices is located on two substrates. Such an arrangement provides significant advantages over the solutions according to the prior art.

In detail, due to the fact that the power and control connectors, such as terminals, are provided solely in the contact area and thus in a center area, the advantage may be achieved according to which installation space may be saved significantly because of which a room saving design of the power semiconductor module and exemplarily of the base plate is achievable. In other words, by locating all power and control terminals to the center of the power semiconductor module, or its base plate, respectively, no space is wasted on the side of the base plate. This in turn allows that more installation space on the base plate is remaining for locating the chips, or power semiconductor devices, respectively.

Therefore, given a defined current rating, the size of the module may be decreased, or, alternatively, given a defined size of the power semiconductor module, the current rating may be increased.

The power semiconductor module thus solves the challenge according to which having a high current rating of the module with limited size is often required. A high current rating may thereby for example be achieved in case a plurality of power semiconductor devices, exemplarily several IGBT chips and diode chips, are connected in parallel. Due to the arrangement as described above, the active area of the power semiconductor devices can be maximized which in turn improves the performance of the power semiconductor module.

A typical disadvantage of conventional power semiconductor modules may be seen in the fact according to which only limited space is remaining for the silicon chips which in turn significantly limits the achievable current rating of the module. Such negative effect, however, may effectively be avoided when providing a power semiconductor module having an arrangement as described.

In contrast to the disadvantages known in the prior art solutions, the arrangement of the power semiconductor module as described here allows the power semiconductor module to be more competitive over known solutions due to the fact that more installation space is available for the active area of the module and thus for the mainly active parts of the power semiconductor module, i.e. the power semiconductor devices. This allows significantly improving the current rating of the power semiconductor module at a given size.

Apart from the above, a power semiconductor module as described above may allow implementing save insulation distances between the terminals and connectors on the one side and the power semiconductor devices on the other side. This in turn allows a very secure working behaviour of the power semiconductor module. Further, the risk of damaging the power semiconductor devices during production processes may significantly be lowered. The power semiconductor module as described here thus provides a measure for reducing service work and improving the reliability of the working behaviour of the power semiconductor module.

Compared to conventional designs of power semiconductor modules, the AC power terminal foot of a semiconductor module according to the invention, for example, may have a larger distance to the power semiconductor devices such as the silicon chips. Such increased distance in fact is a great advantage in the production process and in detail when connecting the terminals or connectors, respectively, to the substrate. This may mainly be due to the fact that the connection technique may be chosen freely without negatively influencing the power semiconductor devices. In other words, even when using comparably harsh connection methods or conditions, respectively, the terminal may be fixed in a manner being very gentle with regard to the power semiconductor devices present, and thus without having a significant danger of damaging the devices. Apart from that, there is enough of space which might be adequate for the periphery potentially being required for fixing the terminal to the base plate, or the substrate, respectively.

Furthermore and like indicated above, the switching behaviour is a very important feature of power semiconductor modules. With this regard, a power semiconductor module like described here exemplarily with the design comprising a connecting area together with a first device area and the second device area may provide a very uniform switching behaviour of the chips as the arrangement of the chips may be chosen very freely and according to the desired need.

Exemplarily, it is provided that all the power semiconductor devices in a device area are located in two parallel lines being aligned parallel to the width of the base plate. In other words, all the power semiconductor devices in the first device area are located in only two parallel lines being aligned parallel to the width of the base plate and thus essentially perpendicular to the current flow and all the power semiconductor devices in the second device area are located in only two parallel lines being aligned parallel to the width of the base plate and thus essentially perpendicular to the current flow. Such an arrangement may show an improved and in detail a very uniform switching behaviour. Further, as there is enough space in a power module as described here it is possible without any problem to achieve this arrangement.

In order to achieve such a switching behaviour, it may be advantageous that the first amount of switching power semiconductor devices comprises IGBT devices and diodes and that the second amount of switching power semiconductor devices comprises IGBT devices and diodes. With this regard, the IGBT devices and the diodes may be arranged such, that all IGBT devices are located in a first line of each device area being aligned parallel to the width of the base plate, and that all diodes are provided in a second line of each device area being aligned parallel to the width of the base plate. Such embodiment may allow combining an outstanding performance of the power semiconductor module requiring only very limited space in combination with a very uniform switching behaviour.

According to a further embodiment, the DC+ and DC− power terminals are guided to the first side and the AC-terminal is guided to the second side. Such a power semiconductor module. With this regard, the respective outer power terminals may be guided to the respective sides and located respectively. This embodiment allows an improved switching behavior of the power semiconductor module, as exemplarily the DC+ terminal and the DC− terminal can be arranged close to each other.

In a further preferred embodiment it may further be provided that at least one of the DC+, DC− and AC power terminals is fixed to the substrate by ultrasonic welding. It may be preferred that all of the DC+, DC− and AC power terminals are fixed to the substrate by ultrasonic welding. In detail, it may be provided that the at least one terminal, or preferably all of the terminals is connected to a substrate, or substrate metallization, respectively, by means of ultrasonic welding.

This embodiment allows a very efficient electrical connection having only low ohmic losses so that the working behavior of the module is not or at least not significantly deteriorated. Apart from that, exemplarily when providing a power semiconductor module as described, the above-named advantages of the welding technique may be achieved, however, without showing disadvantages thereof. With this regard, during the ultrasonic welding step, particles may be generated which can deteriorate the direct environment of the welding position. In detail, it may under circumstances not be totally avoided that such particles stick to the chips' termination. This may lead to the disadvantage that during work of the power semiconductor module, such sticking particles may deteriorate the blocking capability of the power semiconductor devices.

By using the design of the power module like described, however, it is provided that the contact area, and thus the position at which all terminals which should be fixed to the base plate is located, is located at a comparably large distance to the power semiconductor devices, or chips, respectively. This may firstly reduce the amount of particles which reach the power semiconductor devices which in turn directly may reduce the pollution of the devices by such welding particles. Furthermore, in case particles anyhow arise, it is possible to extract these more easily which further may reduce damages based on the welding step.

Additionally, ultrasonic welding generally is accompanied with vibrations which sometimes show the danger of damaging the power semiconductor devices, such as by inducing cracks in the silicon of the chips. This negative effect, however, can be avoided or at least significantly be reduced due to the design of the power semiconductor module having the contact area and the device areas like described above.

It may further be provided that the control connector is connected to the substrate by means of bond wires. In other words, the control circuit is connected by wire bonding from the gate print to the substrate of the base plate. This embodiment provides a low ohmic connection and is further achievable with low space. Therefore, such a connection technique may even further decrease the space required and may thus improve the performance of the power semiconductor module.

Regarding the distance between the terminals or connectors, respectively, and the power semiconductor devices, it may be provided that the distance between any power semiconductor device and any connecting position of the DC+, DC− and AC power terminals and the control connector is in the range of ≥6 mm. In other words, the lowest distance which is provided at a power module as described here between a power semiconductor device and the position at which an electrical connector is fixed to the substrate, and thus exemplarily the lowest distance between each of the connectors and each of the power semiconductor devices, is in the before-defined range. The upper border may be given by the size of the baseplate, or the respective substrate as it is generally known for the person skilled in the art. When providing such distances, the before named advantages exemplarily with regard to welding techniques used may be effective. Therefore, according to this embodiment, the danger of damaging parts of the module during production processes may be reduced which allows a reliable working behaviour of the power semiconductor module as described. Apart from that, such distances allow forming the module with a high current rating and only comparably limited space required.

It may further be provided that the connecting area has a length in the range of ≥15 mm to ≤40 mm. The width may have the dimensions correspondingly to the respective substrate, or plurality of substrates, respectively. This embodiment may allow all DC+, DC− and AC power terminals and control connectors to be located in the contact area without deteriorating the performance of the power semiconductor module, thereby anyhow allowing forming the module with extremely low space and a high current rating.

According to a further embodiment, it may be provided that at least one of the first device area and the second device area has a length in the range of ≥20 mm to ≤40 mm. Again, the width may have the dimensions correspondingly to the respective substrate, or plurality of substrates, respectively.

Correspondingly to the above, this embodiment may allow all power devices, exemplarily all IGBT devices and all diodes, to be located in the respective device areas without deteriorating the performance of the power semiconductor module, thereby anyhow allowing forming the module with extremely low space, high current rating and a uniform switching behaviour.

Regarding the length of the connecting area, or the respective device area, it may be provided that this value may be determined as follows. The border between the device area and the connecting area may be a line parallel to the width of the base plate which is located in a position according to the length of the base plate at half the distance between the power semiconductor device which is nearest to the connecting area and the connecting position for fixing a DC+, DC−, AC or control connector which is nearest to the device area. The further border of the device area may be at a line parallel to the width of the base plate which corresponds the part of a power semiconductor device being located most far away from the connecting area along the length of the base plate.

It may further be advantageous that the connecting area is formed rectangular. Such an arrangement may allow positioning the respective connectors in a room saving manner and further allows to position the connectors in a free manner. Exemplarily, the borders referring to a line parallel to the width of the base plate and thus the length of the connecting area may be determined as described above. A rectangular arrangement may be reached in case at least two connecting positions are located at one line parallel to the width and being the base for the border of the connecting area.

With regard to further advantages or features of the power semiconductor module, it is referred to the figures as well as to the description of the figures.

BRIEF DESCRIPTION OF DRAWINGS

These and other aspects of the invention will be apparent from and elucidated with reference to the embodiments described hereinafter.

In the drawings.

DETAILED DESCRIPTION OF THE INVENTION

Figure 1:
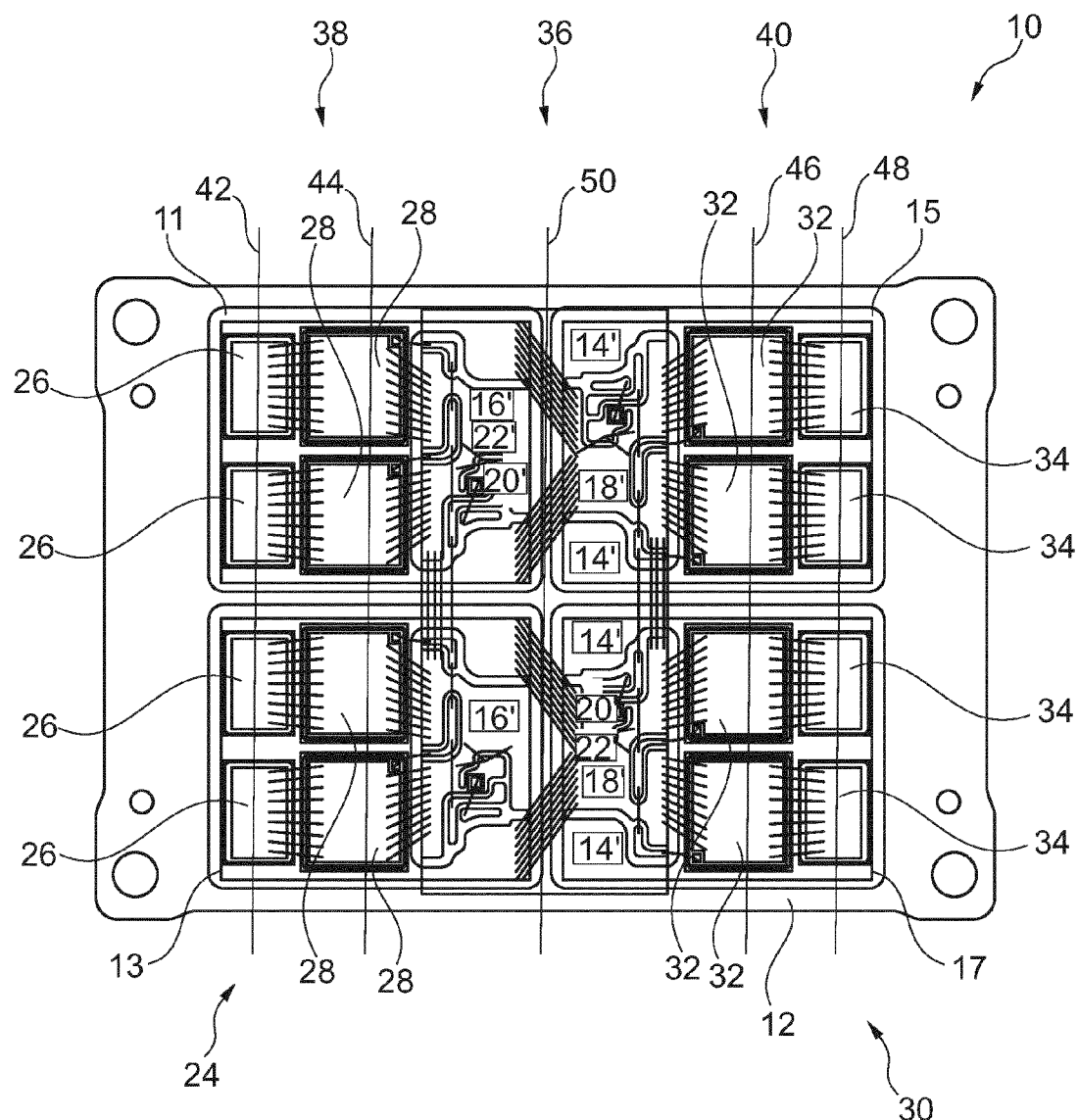
FIG. 1 shows a schematic view onto a part of a power semiconductor module.

Within the following description of the drawings, the same reference numbers refer to the same components. Generally, only the differences with respect to the individual embodiments are described. When several identical items or parts appear in a figure, not all of the parts have reference numerals in order to simplify the appearance.

Figure 2:
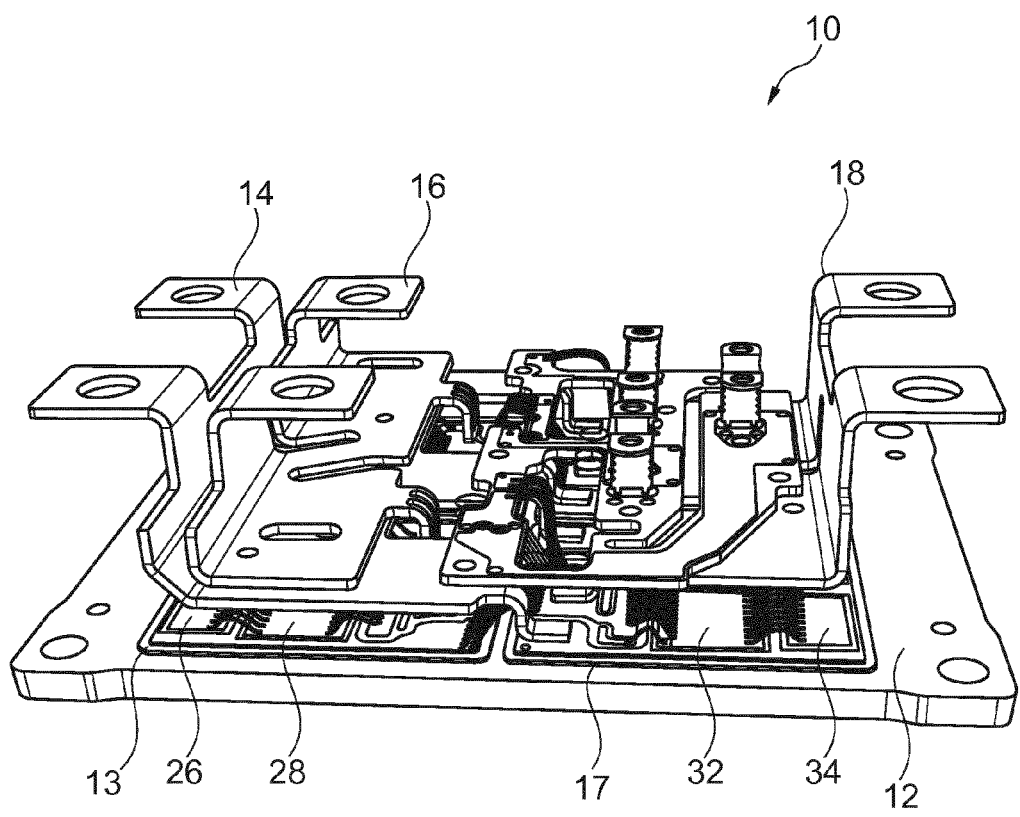
FIG. 2 shows a schematic view to the power semiconductor module according to FIG. 1.

FIGS. 1 and 2 show a view of a power semiconductor module 10. FIG. 1 shows the top view of the power semiconductor module 10 without the power and auxiliary terminals and the gate print.

The power semiconductor module 10 comprises an electronic circuit being provided on a base plate 12, wherein located on the base plate 12 are electrical connectors comprising a DC+ power terminal 14, a DC− power terminal 16 and an AC power terminal 18. With this regard, FIG. 1 shows only the positions 14', 16', 18' at which the respective power terminals 14, 16, 18 shall be fixed and thus the fixing positions 14', 16', 18'. Further, the positions are shown at which the control circuit should be located. With this regard, connecting positions 20' are shown which are designed for receiving the gate conductor and connecting positions 22' are shown which are designed for receiving the emitter conductor.

In detail, the base plate 12 carries four substrates 11, 13, 15, 17 which carry the respective positions 14', 16', 18', 20', 22'.

It is further shown that the power semiconductor module 10 is designed as a half-bridge module and thus comprises a first amount 24 of switching power semiconductor devices 26, 28 and a second amount 30 of switching power semiconductor devices 32, 34. The first amount 24 may be called low side switch and the second amount 30 may be called high side switch.

It is further provided that the base plate 12 comprises a contact area 36, a first device area 38 and a second device area 40, wherein the contact area 36 is positioned in a center of the base plate 10 such, that the first device area 38 is positioned at a first side of the contact area 36 and that the second device area 40 is positioned at a second side of the contact area 36, the second side being arranged opposite to the first side. Like can be seen, the DC+, DC− and AC power terminals and the control connectors are positioned in the contact area 36, wherein the first amount 24 of switching power semiconductor devices 26, 28 is positioned in the first device area 38 and wherein and the second amount 30 of switching power semiconductor devices 32, 34 is positioned in the second device area 40. With regard to the power semiconductor devices 26, 28, 32, 34, it may be provided that the devices 26, 34 are diodes and that the devices 28, 32 are IGBTs. Further, it is shown that all the chips or power semiconductor devices 26, 28, 32, 34, respectively are arranged such, that they are located on a line 42, 44, 46, 48 being aligned parallel to the width of the base plate (12) and thus essentially perpendicular to the current flow. Each device area 38, 40 may comprise one geometric line 44, 46 being aligned parallel to the width of the base plate (12) in which diodes as power semiconductor devices 26, 34 are provided and a further geometric line 42, 48 being parallel to the line 44, 46 in which IGBT devices as power semiconductor devices 28, 32 are provided and thus as well being aligned parallel to the width of the base plate (12). The geometric lines 42, 48 defined the location of diodes as power semiconductor devices 42, 48. These lines 42, 44, 46, 48 are further parallel to a geometrical central line 50 which proceeds through the center of the contact area 36 and which is parallel to the width of the base plate (12) and which may symmetrically divide the base plate 12 in a part carrying the first device area 38 and a part carrying the second device area 40.

FIG. 2 further shows that the DC+ and DC− power terminals 14, 16 are guided to the first side and in that the AC-terminal 18 is guided to the second side.

Therefore, the contacts of the outer DC+ and DC− power terminal 14, 16 are on the left. The contacts of the outer AC power terminal 18 is on the right. The DC+ and DC− power terminals 14, 16 are guided low inductively to the center of the power semiconductor module 10 and exemplarily to the contact area 36. Also the AC power terminal 18 is guided towards the center of the power semiconductor module 10 and exemplarily to the contact area 36. All control signals are also guided via a gate print to the center of the power semiconductor module 10 and exemplarily to the contact area 36.

REFERENCE SIGNS LIST 10 power semiconductor module
11 substrate
12 base plate
13 substrate
DC+ power terminal
14' position
15 substrate
16 DC− power terminal
16' position
17 substrate
18 AC power terminal
18' position
20' position
22' position
24 first amount
26 power semiconductor device
28 power semiconductor device
30 second amount
32 power semiconductor device
34 power semiconductor device
36 contact area
38 first device area
40 second device area
42 line
44 line
46 line
48 line
50 central line

The invention claimed is:

1. A power semiconductor module, comprising:
a base plate with at least one substrate located on the base plate,
an electronic circuit located on the at least one substrate,
a positive DC power terminal located directly on the at least one substrate,
a negative DC power terminal located directly on the at least one substrate,
an AC power terminal located directly on the at least one substrate,
a control connector located directly on the at least one substrate,
a first amount of switching power semiconductor devices,
a second amount of switching power semiconductor devices,
wherein the base plate comprises a contact area, a first device area and a second device area, the contact area being positioned in a center of the base plate such that the first device area is positioned at a first side of the contact area and that the second device area is positioned at a second side of the contact area, the second side being arranged opposite to the first side,
wherein the positive DC power terminal, the negative DC power terminal, the AC power terminal and the control connector physically contact the at least one substrate in the contact area with the first amount of switching power semiconductor devices positioned in the first device area in two parallel lines of the first device area aligned with a width of the base plate and the second amount of switching power semiconductor devices positioned in the second device area in two parallel lines of the second device area aligned with the width of the base plate, and
wherein the shortest distance between any power semiconductor device and any fixing position of the at least one substrate and the positive DC power terminal, the negative DC power terminal or the AC power terminal is 6 mm, the contact area has a length in a range of ≥15 mm to ≤40 mm, and at least one of the first device area and the second device area has a length in a range of ≥20 mm to 40 mm.

2. The power semiconductor module of claim 1, wherein the first amount of switching power semiconductor devices comprises a first plurality of IGBT devices and a first plurality of diodes and that the second amount of switching power semiconductor devices comprises a second plurality of IGBT devices and a second plurality of diodes.

3. The power semiconductor module of claim 2, wherein the first plurality of IGBT devices are arranged in one of the two parallel lines of the first device area, the first plurality of diodes are arranged in the other one of the two parallel lines of the first device area, the second plurality of IGBT devices are arranged in one of the two parallel lines of the second device area, and the second plurality of diodes are arranged in the other one of the two parallel lines of the second device area.

4. The power semiconductor module of claim 1, wherein the positive DC power terminal and the negative DC power terminal extend towards the first side and the AC power terminal extends towards the second side.

5. The power semiconductor module of claim 1, wherein the control connector is connected to the at least one substrate by bond wires.

6. The power semiconductor module of claim 1, wherein the contact area is formed rectangular.

7. The power semiconductor module of claim 1, wherein the at least one substrate comprises four substrates positioned on the base plate, wherein each of the four substrates carries a part of the electric circuit.

8. The power semiconductor module of claim 1, wherein the at least one substrates comprises at least two substrates arranged identically.

9. The power semiconductor module of claim 3, wherein the positive DC power terminal and the negative DC power terminal extend towards the first side and the AC power terminal extends towards the second side.

10. The power semiconductor module of claim 3, wherein the control connector is connected to the at least one substrate by bond wires.

11. The power semiconductor module of claim 3, wherein the contact area is rectangular.

12. The power semiconductor module of claim 3, wherein the at least one substrate comprises four substrates positioned on the base plate, wherein each of the four substrates carries a part of the electronic circuit.

13. The power semiconductor module of claim 3, wherein the at least one substrate comprises at least two substrates arranged identically.

14. A power semiconductor module, comprising:
a base plate with at least one substrate located on the base plate,
an electronic circuit disposed on the at least one substrate,
a positive DC power terminal disposed directly on the at least one substrate,
a negative DC power terminal disposed-directly on the at least one substrate,
an AC power terminal disposed directly on the at least one substrate,
a control connector disposed directly on the at least one substrate,
a first amount of switching power semiconductor devices,
a second amount of switching power semiconductor devices, wherein the base plate comprises a contact area, a first device area and a second device area, the contact area being positioned in a center of the base plate such that the first device area is positioned at a first side of the contact area and that the second device area is positioned at a second side of the contact area, the second side being arranged opposite to the first side, and wherein the positive DC power terminal, the negative DC power terminal, the AC power terminal and the control connector physically contact the at least one substrate in the contact area with the first amount of switching power semiconductor devices positioned in the first device area in two parallel lines of the first device area aligned with a width of the base plate and the second amount of switching power semiconductor devices positioned in the second device area in two parallel lines of the second device area aligned with the width of the base plate.

15. The power semiconductor module of claim 14, wherein the first amount of switching power semiconductor devices comprises a first plurality of IGBT devices and a first plurality of diodes and that the second amount of switching power semiconductor devices comprises a second plurality of IGBT devices and a second plurality of diodes.

16. The power semiconductor module of claim 15, wherein the first plurality of IGBT devices are arranged in one of the two parallel lines of the first device area, the first plurality of diodes are arranged in the other one of the two parallel lines of the first device area, the second plurality of IGBT devices are arranged in one of the two parallel lines of the second device area, and the second plurality of diodes are arranged in the other one of the two parallel lines of the second device area.

17. The power semiconductor module of claim 14, wherein the positive DC power terminal and the negative DC power terminal extend towards the first side and the AC power terminal extends towards the second side.

18. A power semiconductor module, comprising:
a base plate with at least one substrate located on the base plate,
an electronic circuit disposed on the at least one substrate,
a positive DC power terminal disposed directly on the at least one substrate,
a negative DC power terminal disposed directly on the at least one substrate,
an AC power terminal disposed directly on the at least one substrate,
a control connector disposed directly on the at least one substrate,
a first amount of switching power semiconductor devices positioned in two parallel lines in a first device area,
a second amount of switching power semiconductor devices positioned in two parallel lines in a second device area,
wherein the base plate comprises a contact area positioned between the first device area and the second device area,
wherein the positive DC power terminal, the negative DC power terminal, the AC power terminal and the control connector physically contact the at least one substrate in the contact area, and
wherein the shortest distance between any power semiconductor device of the first amount of switching power semiconductor devices and the second amount of switching power semiconductor devices and any fixing position of the at least one substrate and the positive DC power terminal, the negative DC power terminal or the AC power terminal is ≥6 mm.

19. The power semiconductor module of claim 18, wherein the first amount of switching power semiconductor devices comprises a first plurality of IGBT devices and a first plurality of diodes and that the second amount of switching power semiconductor devices comprises a second plurality of IGBT devices and a second plurality of diodes, and wherein the first plurality of IGBT devices are arranged in one of the two parallel lines in the first device area, the first plurality of diodes are arranged in the other one of the two parallel lines in the first device area, the second plurality of IGBT devices are arranged in one of the two parallel lines in the second device area, and the second plurality of diodes are arranged in the other one of the two parallel lines in the second device area.

20. The power semiconductor module of claim 18, wherein the positive DC power terminal and the negative DC power terminal extend away from the contact area in a first direction and the AC power terminal extends away from the contact area in a second direction that is opposite the first direction.

* * * * *